United States Patent [19]
Melton

[11] Patent Number: 5,282,565
[45] Date of Patent: Feb. 1, 1994

[54] SOLDER BUMP INTERCONNECTION FORMED USING SPACED SOLDER DEPOSIT AND CONSUMABLE PATH

[75] Inventor: Cynthia M. Melton, Bolingbrook, Ill.

[73] Assignee: Motorola, Inc., Schaumburg, Ill.

[21] Appl. No.: 998,152

[22] Filed: Dec. 29, 1992

[51] Int. Cl.⁵ .............................. H05K 3/34
[52] U.S. Cl. .................. 228/180.22; 228/215; 228/248.5
[58] Field of Search .............. 228/180.2, 118, 215, 228/248

[56] References Cited

U.S. PATENT DOCUMENTS

| | | | |
|---|---|---|---|
| 4,914,814 | 4/1990 | Behun et al. | 29/843 |
| 5,154,341 | 10/1992 | Melton et al. | 228/180.2 |
| 5,172,852 | 12/1992 | Bernardoni et al. | 228/180.2 |
| 5,180,097 | 1/1993 | Zenshi | 228/180.2 |

Primary Examiner—Samuel M. Heinrich
Attorney, Agent, or Firm—Douglas D. Fekete

[57] ABSTRACT

A solder bump interconnection (34) bonding a metal bump (30) affixed to an integrated circuit component (10) to a terminal pad (18) of a printed circuit board (12) is formed using a consumable path (24) and a solder deposit (28) applied to the path spaced part from the terminal pad. In addition to the terminal pad, the printed circuit board includes a solder-nonwettable surface (21). The consumable path extends from the terminal pad on the solder-nonwettable surface and is formed oa solder-soluble metal. The solder deposit is heated, preferably by a laser beam, to form molten solder that is drawn along the pathdissolving the path as it proceeds. At the terminalmolten solder wets the pad and the metal bump and solidifies to complete the inerconnection.

12 Claims, 1 Drawing Sheet

SOLDER BUMP INTERCONNECTION FORMED USING SPACED SOLDER DEPOSIT AND CONSUMABLE PATH

BACKGROUND OF THE INVENTION

This invention relates to a method for forming a solder bump interconnection for attaching an integrated circuit component to a printed circuit board. More particularly, this invention relates to such method in which a solder deposit is applied to a consumable path on the printed circuit board and is drawn along the path onto a terminal pad during reflow to complete the interconnection.

In the manufacture of a microelectronic package, it is known to mount an integrated circuit component to a printed circuit board by a plurality of solder bump interconnections that not only physically attach the component to the board, but also electrically connect the component to the board for conducting electrical signals to or from the component for processing. For this purpose, the printed circuit board comprises a circuit trace, typically formed of copper, which features terminal pads at which the interconnections are made. The component includes a series of metal bumps, typically formed of a solder. The component is superposed onto the board to form an assembly such that each solder bump rests against a corresponding terminal pad. The assembly is then heated to reflow the solder onto the terminal pads. Alternately, solder may be deposited onto the terminal pads and reflowed to bond to the bumps, without necessarily reflowing the bumps. In any event, upon cooling, the solder resolidifies to complete the interconnections.

In the formation of a strong solder bond, it is essential that the molten solder flow into intimate contact with the faying surface during reflow, which phenomena is referred to as wetting. In the absence of wetting, surface tension tends to cause the molten solder to bead up without spreading onto or adhering to the surface.

In conventional practice, the solder is reflowed by heating the entire assembly, for example, within an oven. The oven temperature is typically set as much as 40° C. to 600° C. higher than the solder melting temperature to accelerate melting and minimize the time at the elevated temperature, as well as assure reflow at all interconnections despite temperature variations within the oven. In designing a package, it is necessary to select a solder alloy having a reflow temperature suitably low to avoid damage to other electronic features of the assembly. However, higher temperature solder alloys may have mechanical or other properties that are optimum for a particular package. Therefore, there exists a need for a method for reflowing solder to complete a solder bump interconnection that may be carried out without exposing the entire assembly to high temperatures, so as to permit the use of higher temperature solder alloys without damage to other features of the package.

SUMMARY OF THE INVENTION

This invention contemplates forming a solder bump interconnection between a terminal pad on a printed circuit board and a metal bump on an integrated circuit component. In addition to the terminal pad, which is formed of solder-wettable metal, the printed circuit board includes a solder-nonwettable surface adjacent to the terminal pad. A consumable path extends on the solder-nonwettable surface from the terminal pad and is formed of a solder-soluble metal, that is, a metal that dissolves in molten solder. A deposit comprising solder metal is applied to the consumable path spaced apart from the terminal pad. To complete the interconnection, the component is superposed onto the printed circuit board such that the metal bump rests against the terminal pad. The solder deposit is then heated to melt the solder metal, whereupon the molten solder is drawn along the path to the terminal pad, dissolving the path as it proceeds. At the terminal pad, the molten solder wets the terminal pad and the bump and, upon cooling, solidifies to bond the bump to the terminal pad to complete the interconnection.

Therefore, this invention provides a method that forms a solder bump interconnection using solder metal deposited onto a consumable path apart from the terminal pad. In a particularly advantageous aspect of this invention, the solder metal is heated in a manner that localizes the heat at the solder deposit, for example, using a laser beam. This permits the solder to be reflowed without subjecting remote features of the assembly to elevated temperatures that might otherwise damage the features.

DESCRIPTION OF THE DRAWINGS

The present invention will be further illustrated with reference to the accompanying drawings wherein.

DETAILED DESCRIPTION OF THE INVENTION

Figure 1:
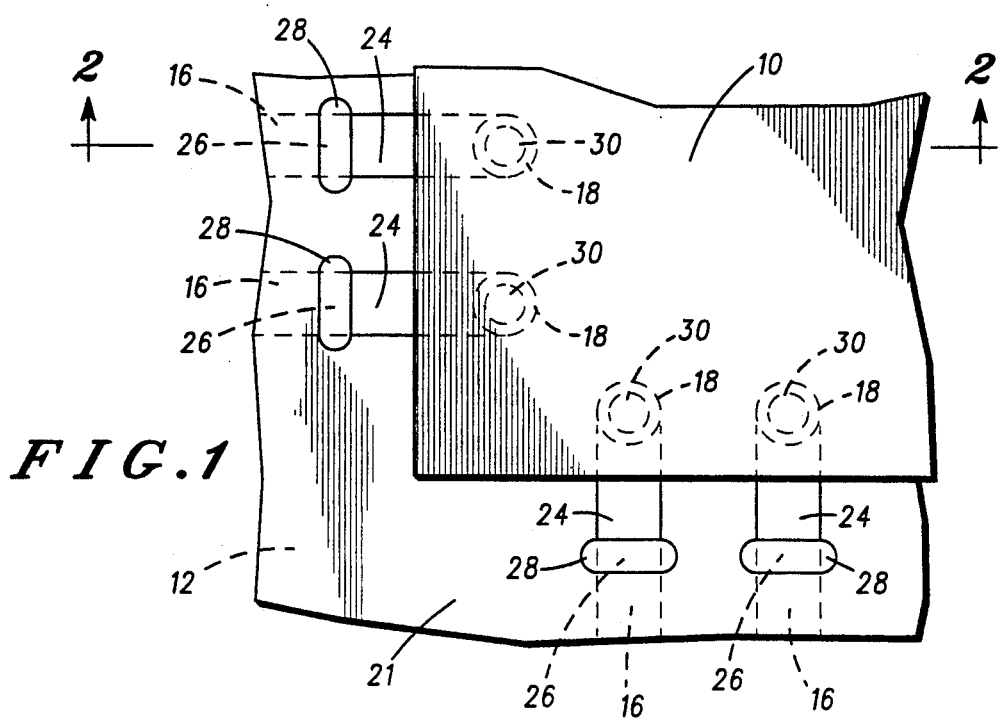
FIG. 1 is a plan view of an assembly in preparation for forming solder bump interconnections in accordance with this invention.
Figure 2:
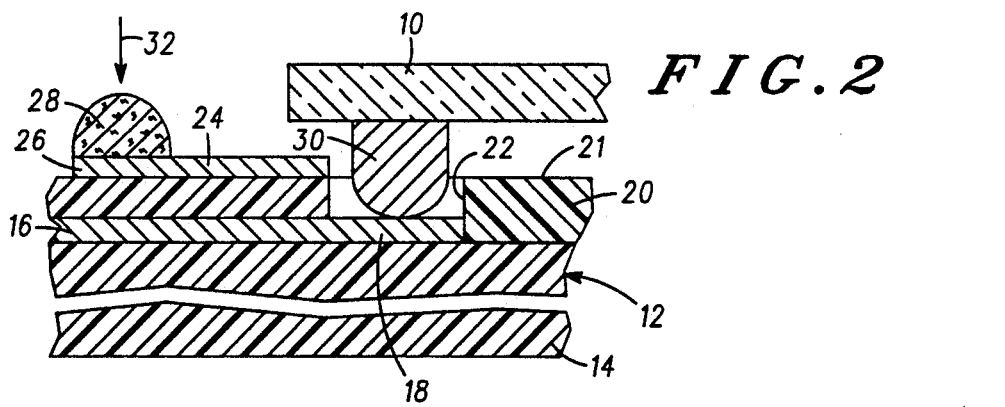
FIG. 2 is a cross-sectional view of the assembly in FIG. 1, taken along line 2—2, showing the assembly prior to solder reflow.
Figure 3:
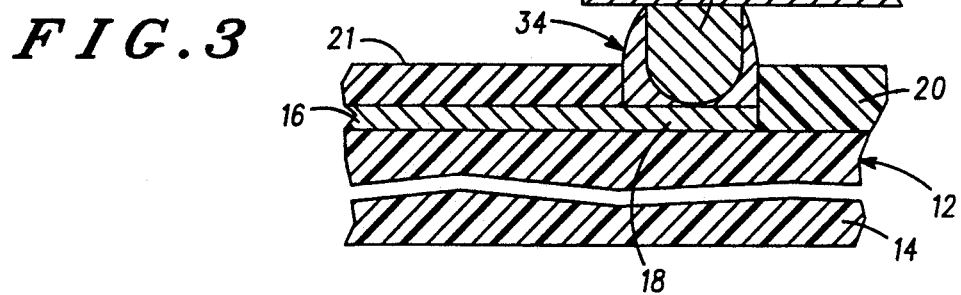
FIG. 3 is a cross-sectional view similar to FIG. 2, but showing a solder bump interconnection formed in accordance with this invention.

In a preferred embodiment, referring to FIGS. 1-3, the method of this invention is employed to mount an integrated circuit component 10 to a printed circuit board 12 by reflowing a solder composed of a tin-lead alloy.

Printed circuit board 12 comprises a dielectric substrate 14 of the type referred to as an FR4 card and composed of an epoxy resin and glass fiber laminate. Board 12 further includes a circuit trace 16 formed of copper and comprising a plurality of terminal pads 18. For purposes of clarity in illustration, only a region of board 12 having a few terminal pads for attaching component 10 is depicted, although it will be appreciated that a typical package may include as many as several hundred terminals to make the electrical connections necessary to carry out the intended electrical operations of component 10. Also, it will be appreciated that trace 16 extends onto adjacent regions of board 12 for connection to additional electrical features, which may include features that tend to be damaged at solder reflow temperatures.

In accordance with this embodiment, circuit board 12 further comprises a polymeric film 20 generally covering substrate 14 and trace 16 and is formed of a suitable polymer that provides a solder-nonwettable surface 21. In this example, film 20 is an epoxy acrylate resin of the type typically used as a solder stop material. Suitable resin is commercially available from Ciba Geigy Corporation under the trade designation Probimer. Openings 22 are defined in polymer layer 20 to expose terminal pads 18, as shown in FIG. 2. Printed circuit board 12 further comprises a plurality of consumable paths 24 applied to polymeric film 20. Each path 24 extends from an opening 22 at a terminal pad 18 and includes an end section 26 remote from the terminal pad. A solder deposit 28 formed of a solder paste is applied to end section 26. A suitable paste comprises solder metal particles and a fugitive resinous binder. In this example, the solder particles are composed of an alloy preferably comprising about 5 weight percent tin and the balance substantially lead. A suitable binder is ethyl cellulose compound. Paths 24 are formed of tin metal that is readily soluble in the molten tin-lead solder.

Printed circuit board 12 is preferably fabricated from a copper-plated FR4 card of the type that is readily commercially available. The card includes a uniform copper plate having a thickness of about 17 microns and covering the surface to provide a basis for trace 16. A photoresist mask is applied and defined in a pattern corresponding to the desired trace, such that the metal for the trace is protected whereas the metal about the trace is exposed. The board with the mask is immersed in an aqueous copper-etching solution containing ammonium persulfate to remove the exposed copper and thereby define trace 16. Following removal of the photoresist mask, substrate 14 and trace 16 are coated with polymer film 20. In this example, a liquid containing a precursor for the desired epoxy polymer is sprayed onto the card and cured. Paths 24 are then deposited onto layer 20, for example, by sputtering tin metal using a stencil mask. Openings 22 are formed in polymer layer 20 by laser ablation to expose terminal pads 18. A paste containing the solder particles and the fugitive binder dispersed in a vaporizable vehicle is screen printed onto end sections 26 and dried to form deposits 28.

In preparation for forming the solder bump interconnections, a series of solder bumps 30 are affixed to component 10. Component 10 may be either a semiconductor chip adapted for flip-chip bonding or a component comprising semiconductor chip mounted on a ceramic or other suitable carrier. In this example, bumps 30 are composed of solder alloy containing about 5 weight percent tin and the balance lead. Preformed microballs of the solder alloy are individually placed onto solder-wettable contacts (not shown) on component 10 and heated to a temperature effective to melt and reflow the solder alloy. Upon cooling, the solder bonds to the component to form bumps 30.

To complete the interconnections, component 10 with bumps 30 is superposed onto printed circuit board 12 to form an assembly in which each bump 30 rests against a corresponding terminal pad 18, as shown in FIG. 2. A flux, such as a white rosin composition, may be applied to the tips of bumps 30 to promote wetting of terminal pad 18. Thereafter, each deposit 28 is irradiated by a laser beam, indicated by arrow 32, emitted by a 100 watt continuous wavelength NdYAG laser device. Irradiation is continued for a time effective to vaporize the expendable binder and to melt the solder particles, whereupon the molten solder coalesces into a microdroplet on end section 26. Since the solder is inhibited from wetting the polymer, solder from portions of the deposit initially on the adjacent polymer surface is drawn into the microdroplet. At path 24, the molten solder flows into intimate contact with the tin in a manner similar to wetting, but also accompanied by dissolution of the tin. As the underlying path dissolves, the molten solder approaches the polymer surface. However, since the solder is inhibited from wetting the polymer surface, the molten solder tends to flow onto the adjacent path. In this manner, the molten solder is drawn along the path to opening 22, consuming the metal of the path in the process. At opening 22, the molten solder wets bump 30 and terminal pad 18, and upon cooling, solidifies to form solder bump interconnection 34 in FIG. 3.

Therefore, solder bump interconnections 34 are derived from solder bumps 30 affixed separately to the component and solder from deposits 28 spaced apart from terminal pads 18 on printed circuit board 12. The molten solder is delivered along paths 24 that are consumed so as not to leave a metallic residue that might interfere with electrical operation of the product package. It is a significant advantage of this invention that the solder may be applied to the board at locations that are not covered by the component and are thus exposed for laser irradiation to allow localized heating. Thus, the solder may be reflowed without heating other locations of the assembly, in contrast to conventional methods that heat the entire assembly to reflow the solder at the terminal pads. As a result, heat sensitive features of the assembly are protected from damage during reflow. Moreover, as in the described embodiment, the interconnections may be completed without reflow of the bumps affixed to the component. This allows high temperature solder to be employed for the bumps to optimize bonding to the component. Also, the bumps remain solid during reflow to act as spacers and prevent uncontrolled collapse of the component toward the board to achieve an optimum gap in the product package. Nevertheless, the method of this invention provides sufficient molten solder to complete the desired interconnections to physically and electrically connect the component and the board. While in the described embodiment, a single, isolated path connects each deposit to the corresponding terminal pad, the method may be adapted utilizing paths that extend from multiple terminal pads and converge at a common end section to which is applied a single solder deposit, thereby permitting a single deposit to be targeted and heated by the laser beam, while allowing molten solder to be concurrently supplied to several pads for forming interconnections.

While not limited to any particular theory, this invention utilizes a combination of materials having particular properties with respect to molten solder. The terminal pad and metal bumps are formed of metal that is readily wet by the molten solder, which is essential to forming a strong solder bond. The terminal pad is bordered by a surface that is formed of a solder-nonwettable material, that is, a material onto which the solder does not spread or flow into intimate contact. The consumable path is applied onto the solder-nonwettable surface and is formed of a material that is soluble in the molten solder. As used herein, solder-soluble metal refers to any metal that dissolves in the molten solder. The path overlies and is surrounded by the solder-nonwettable surface. Under these conditions, the molten solder from the deposit is inhibited from flowing onto the solder-nonwettable surface, but rather coalesces into a microdroplet on the path and thereafter spreads along the path, dissolving the path as it flows. At the terminal pad, the molten solder wets and bonds to the terminal pad and the metal bump to complete the interconnection.

Accordingly, an interconnection may be produced by this invention to a terminal pad formed of any suitable solder-wettable metal. Copper is relatively inexpensive and exhibits high electrical conductivity and other properties that are particularly well suited for use as a circuit trace. Also, the terminal pad may include a metallic coating to protect the trace metal from oxidation and enhance bonding. For example, a gold coating may be applied to the terminal pad, which dissolves into the molten solder during reflow to expose a clean copper surface. In general, the adjacent, nonwettable surface may be formed of any suitable polymeric material. Preferred materials include epoxy resins and polyimide resins that are readily commercially available for coating printed circuit boards, for example, by spinning or spraying. Alternately, suitable nonwettable surfaces may be formed by ceramic layers or metals having oxidized surfaces are not wet by solder. In the described embodiment, the bump is formed of solder compatible with the molten solder. However, the small heat capacity of the molten solder is believed to limit any melting of the solder bump to the immediate surface. Alternately, the bump may be formed of copper or other nonsolder metal that provides a wettable faying surface to form the desired bonding.

In the described embodiment, the solder deposit is formed of a hypereutectic lead alloy containing about 5 weight percent tin and having a liquidus temperature of about 320° C. It is pointed out that, in conventional methods that require heating the entire assembly, such high lead solder is not generally utilized in forming interconnections to an FR4 card, since prolonged exposure to the high reflow temperature tends to damage the card. Nevertheless, such high lead solder is suitable for use in the method of this invention, since heating is suitably confined to the deposit. Also, lead and tin form a low melting eutectic composition comprising about 37 weight percent lead and the balance tin and having a liquidus temperature of about 183° C. Thus, dissolution of tin from the path into the molten solder tends to reduce the melting point of the resulting alloy, thereby permitting the solder to remain molten for an extended time sufficient to travel to the pad and form the desired solder bonds despite dissipation of some heat.

Although this invention has been disclosed in an embodiment that utilizes a particular high temperature, high lead solder, it may be carried out utilizing any suitable solder alloy. In general, common solders used in microelectronic solder interconnections are alloys composed predominantly of one or more metals selected from the group consisting of tin, lead, indium and bismuth. These include alloys of metals that are capable of combining to form a eutectic composition. For example, indium and lead form a eutectic composition comprising about 30 weight percent lead. Tin and indium form a eutectic alloy containing about 50 weight percent indium. Tin and about 58 weight percent bismuth form a eutectic alloy. Also, the method may suitably carried out using a high tin alloy, such as tin alloy containing 3.5 weight percent silver or 5 weight percent antimony. As in the described embodiment, it is preferred to deposit a solder that is deficient in a constituent relative to the eutectic composition, and to form the path of the constituent, so that dissolution of the path reduces the melting point of the solder alloy to avoid premature solidification of the alloy prior to reaching the terminal pad. While in the described embodiment the path is formed of tin metal, the path may be formed of any metal that is dissolved by the molten solder. Indium, palladium, silver, gold and platinum are generally soluble in common tin solders and may be readily applied to form the path. Alternately, the path may be formed of an alloy of metals soluble in the molten solder, such as eutectic tin-lead alloy.

Although, in the practice of this invention, the solder may be reflowed using any suitable heat source, it is a significant advantage of the preferred embodiment to employ a laser device or other suitable means that confines heating to the deposit and thereby avoid heating remote features of the component or board that might be damaged at the solder reflow temperature. Upon melting, the solder liquid remains in the liquid phase for the short time necessary to travel along and consume path and to wet the faying surfaces of the terminal pad and the bump, whereafter the heat is dissipated to solidify the solder and complete the interconnection. The small heat content of the solder microdroplet is readily dissipated without significant temperature increase in the surrounding material. While in the described embodiment, the path was formed by sputtering, the path may be applied by any suitable technique, including electroless plating or electroplating.

While this invention has been described in terms of certain embodiments thereof, it is not intended that it be limited to the above description, but rather only to the extent set forth in the claims that follow.

The embodiments of the invention in which the exclusive property or privilege is claimed are defined as follows:

1. A method for forming a solder bump interconnection for attaching an integrated circuit component to a printed circuit board, said method comprising
   fabricating a printed circuit board comprising a solder-wettable terminal pad, a solder-nonwettable surface adjacent to the solder-wettable terminal pad, and a consumable path extending from the terminal pad and overlying the solder-nonwettable surface, said consumable path being formed of a solder-soluble metal,
   applying a solder deposit onto the expendable runner spaced apart from the terminal pad,
   superposing an integrated circuit component onto the circuit board, said integrated circuit component comprising a metal bump and being arranged relative to the printed circuit board such that the metal bump rests against the terminal pad,
   heating the solder deposit to a temperature effective to melt the solder deposit and form molten solder in contact with the consumable path, whereupon the molten solder dissolves the consumable path and is drawn along the consumable path to the terminal pad, and
   cooling to solidify the solder at the terminal pad, whereupon the solder bonds to the terminal pad and to the metal bump to form a solder bump interconnection.

2. A method in accordance with claim I wherein the solder deposit is composed of a solder paste.

3. A method in accordance with claim 1 wherein the solder-nonwettable surface is formed of a polymeric material.

4. A method in accordance with claim 1 wherein the metal bump is formed of a solder metal or a solder-wettable metal.

5. A method for forming a solder bump interconnection for attaching an integrated circuit component to a printed circuit board, said method comprising providing a printed circuit board comprising a solder-wettable terminal pad, a solder-nonwettable polymeric surface adjacent to the terminal pad, and consumable path overlying the solder-nonwettable polymeric surface and extending from the terminal pad, said consumable path being formed of a solder-soluble metal and having an end section spaced apart from the terminal pad, applying a solder paste onto the end section to form a solder deposit composed of solder metal particles and a fugitive binder, affixing a metal bump to the integrated circuit component, said metal bump being formed of a solder metal or a solder-wettable metal, superposing the integrated circuit component onto the printed circuit board such that the metal bump rests against the terminal pad, heating the solder deposit to a temperature effective to vaporize the fugitive binder and to melt the solder metal particles to form molten solder in contact with the consumable path, whereupon the molten solder dissolves the consumable path and is drawn along the consumable path to the terminal pad, and further whereupon the molten solder wets the metal bump and the terminal pad, and cooling to solidify the solder at the terminal pad to form a solder bump interconnection.

6. A method in accordance with claim 5 wherein the solder metal particles are formed of an alloy composed predominantly of a metal selected from the group consisting of tin, lead, indium and bismuth.

7. A method in accordance with claim 5 wherein the solder deposit is heated by irradiation with a laser beam.

8. A method in accordance with claim 5 wherein the consumable path is formed of metal selected from the group consisting of tin, gold, silver, indium, platinum and palladium.

9. A method in accordance with claim 5 wherein the solder-nonwettable polymer surface is formed of a resin selected from the group consisting of epoxy resin and polyimide resin.

10. A method for forming a solder bump interconnection for attaching an integrated circuit component to a printed circuit board, said method comprising providing a printed circuit board comprising a copper terminal pad, a solder-nonwettable polymeric surface adjacent to the terminal pad, and consumable path overlying the solder-nonwettable polymeric surface and extending from the terminal pad, said consumable path being formed of tin and having an end section spaced apart from the terminal pad, applying a solder paste onto the end section to form a solder deposit composed of solder metal particles and a fugitive binder, said solder metal particles being formed of alloy comprising tin and a metallic constitutent capable of alloying with tin to form a eutectic composition having a melting temperature, but wherein said alloy contains tin in an amount less than the eutectic composition and has an initial melting temperature greater than the eutectic melting temperature, affixing a metal bump to the integrated circuit component, said metal bump being formed of a solder metal, superposing the integrated circuit component onto the printed circuit board such that the metal bump rests against the terminal pad, irradiating the solder deposit with a laser beam to heat the deposit to a temperature effective to vaporize the fugitive binder and to melt the solder metal particles to form molten solder in contact with the consumable path, whereupon the molten solder dissolves the consumable path to form an alloy having a reduced melting temperature, and further whereupon the molten solder is drawn along the consumable path to the terminal pad, and wets the metal bump and the terminal pad, and cooling to solidify the solder metal at the terminal pad to form a solder bump interconnection.

11. A method in accordance with claim 10 wherein the solder metal particles are composed of an alloy comprising tin and a metal selected from the group consisting of lead, indium and bismuth.

12. A method in accordance with claim 10 wherein the printed circuit board comprises a plurality of terminal pads and a plurality of consumable paths extending each from a terminal pad and having a common end section, wherein the component comprises a plurality of metal bumps and is arranged such that each bump rests on a corresponding terminal pad, and wherein a single solder deposit is applied to the end section and heated to form molten solder that flows along each path to each terminal pad to concurrently form a plurality of solder bump interconnections.

* * * * *